Feb. 4, 1958

R. J. EHRET 2,822,434

AMPLIFYING APPARATUS

Filed Feb. 15, 1954

INVENTOR.
ROBERT J. EHRET

BY Arthur H. Swanson

ATTORNEY.

2,822,434
Patented Feb. 4, 1958

2,822,434

AMPLIFYING APPARATUS

Robert J. Ehret, Philadelphia, Pa., assignor to Minneapolis-Honeywell Regulator Company, Minneapolis, Minn., a corporation of Delaware Application February 15, 1954, Serial No. 410,161
4 Claims. (Cl. 179—171)

The general object of the present invention is to provide a new and improved alternating current amplifier. More specifically, the present invention is concerned with an amplifier employing transistors as the amplifying elements. A more specific object of the present invention is to provide a transistor amplifier which is characterized by simplicity, high gain, and temperature stability.

Transistors, because of their low power consumption, long life and small size, offer many advantages over vacuum tubes. However, transistors presently available commercially are not stable and are extremely temperature sensitive and consequently introduce many design problems. In addition, the parameters of individual transistors generally differ greatly, introducing still other design problems. In order to provide a readily reproducible, temperature stable amplifier, it is necessary to minimize or eliminate entirely the effects on the circuit of temperature and individual transistor differences.

Accordingly, it is a more specific object of the present invention to provide a new and improved transistor amplifier circuit which is temperature stabilized and relatively independent of individual transistor characteristics. The configuration employed is designed to prevent shifts in the operating points of the transistors when operated over a wide temperature range.

Another specific object of the present invention is to provide a new and improved transistor amplifier in which stable operation is obtained with relatively few components.

Still another specific object of the present invention is to provide a new and improved multistage transistor amplifier in which the individual transistor stages are directly coupled.

Generally, the problem of temperature stabilization in direct coupled amplifiers is much more severe than in condenser coupled amplifiers because the variations of one transistor with temperature are amplified in the next transistor where they are combined with similar variations in that unit. If this process is repeated in succeeding stages the slightest variation in the first stage may cause the entire amplifier to become inoperative.

It is therefore, a further object of this invention to provide a new and improved multistage direct coupled transistor amplifier in which transistor changes are not passed on to succeeding stages.

A still further object of the present invention is to provide a new and improved transistor amplifier utilizing a single power supply and which amplifier will remain operative over a wide range of power supply voltages.

Another still further object of the present invention is to provide an amplifier in which the current drain, at any given power supply voltage, will be constant with variations in temperature and with variations of the characteristics of the individual transistors employed.

The various features of novelty which characterize this invention are pointed out with particularity in the claims annexed to and forming a part of this specification. For a better understanding of this invention, its advantages, and specific objects attained with its use, reference should be had to the accompanying drawings and descriptive matter in which are illustrated and described preferred embodiments of this invention.

Figure 1:
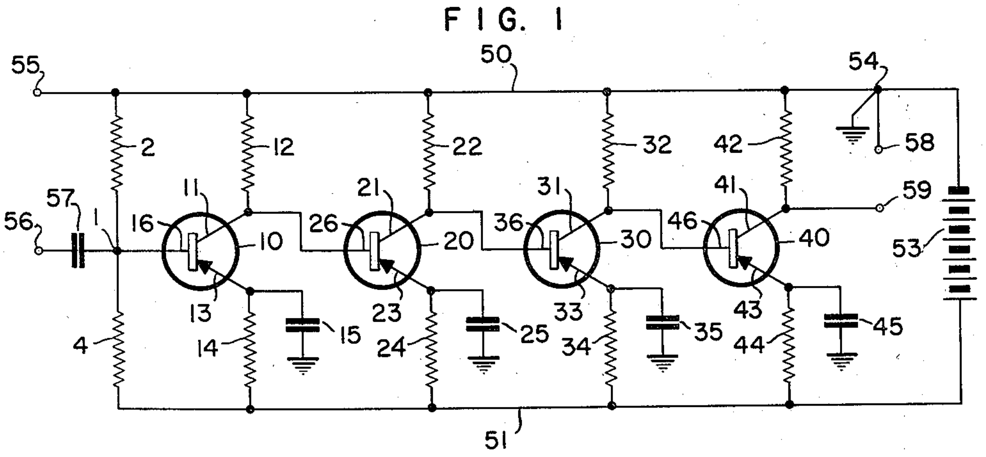
Fig. 1 is a circuit diagram of a preferred embodiment of this invention.

Referring now to Fig. 1, there is shown a circuit diagram of a preferred embodiment of the amplifier which constitutes this invention. This amplifier utilizes a plurality of transistors 10, 20, 30 and 40 as the amplifying elements. As shown, these transistors are of the pnp junction type but it should be understood that they could also be of the npn junction type or of the point contact type transistors with suitable changes in the values of various circuit parameters. Each of these transistors has the usual collector electrode, emitter electrode, and base electrode. The collector electrode 11 of the transistor 10 is connected through the resistor 12 to the conductor 50 while the collector electrode 21 of the transistor 20 is connected through the resistor 22 to the conductor 50. Similarly, the collector electrode 31 of the transistor 30 is connected through the resistor 32 to the conductor 50 while the collector electrode 41 of the transistor 40 is connected through the resistor 42 to the conductor 50.

The emitter electrode 13 of the transistor 10 is connected through the resistor 14 to the conductor 51 while the emitter electrode 23 of the transistor 20 is connected through the resistor 24 to the conductor 51. Similarly, the emitter 33 electrode of the transistor 30 is connected through the resistor 34 to the conductor 51 while the emitter electrode 43 of the transistor 40 is connected through the resistor 44 to the conductor 51. The conductors 50 and 51 are connected to a suitable source of direct current shown here as a battery 53. The conductor 50 may be grounded at any convenient point such as the point 54. The emitter electrodes of the transistors 10, 20, 30 and 40 are also connected to ground through the condensers 15, 25, 35 and 45 respectively.

The collector electrode 11 of the transistor 10 is directly connected to the base electrode 26 of the transistor 20 and the collector electrode 21 of the transistor 20 is directly connected to the base electrode 36 of the transistor 30. Similarly, the collector electrode 31 of the transistor 30 is directly connected to the base electrode 46 of the transistor 40. The base electrode 16 of the transistor 10 is connected to the junction point 1 of the resistors 2 and 4, the latter being connected in series across the conductors 51 and 52.

The input to the amplifier includes the input terminals 55 and 56 and the condenser 57. The input terminal 55 is the end terminal of the conductor 50 and the input terminal 56 is connected through the condenser 57 to the junction point 1. The output from the amplifier is taken across the resistor 42 in the collector circuit of the transistor 40 between the output terminals 58 and 59. The output terminal 58 is connected to ground and the conductor 50 at the point 54 and the output terminal 59 is connected to the collector electrode 41 of the transistor 40.

With both point-contact and junction type transistors it is frequently desirable to operate transistors with constant emitter current and constant collector potential. Since various transistor parameters vary with temperature, the particular bias arrangement selected for supplying the collector potential and emitter current must be designed to minimize the effect of these variations on the transistors quiescent operating point. The bias arrangement employed in this amplifier is designed so as to provide a great degree of temperature stability.

As just described, the transistors 10, 20, 30 and 40 are connected in parallel resistive networks across the power supply. The collector electrode of each transistor is directly coupled to the base electrode of the succeeding stage and thus these two electrodes are at the same potential. The potential at the base electrode of the first transistor stage is that of the junction point 1 between the resistors 2 and 4. Consequently, the values of the collector circuit resistors 12, 22, 32 and 42; the values of the emitter circuit resistors 14, 24, 34 and 44; and the values of the voltage divider resistors 2 and 4 must be selected so as to maintain the desired bias voltage between the collector electrode and base electrode of each transistor.

In addition, it is desirable to have the values of the emitter circuit resistors 14, 24, 34 and 44 relatively high so as to approximate constant current sources for the various emitter currents. One method of attaining these desired bias conditions is to make the resistors 4, 14, 24, 34, and 44 all equal and of a high enough value to maintain relatively constant emitter currents. Then, the value of the collector circuit resistors 12, 22, 32 and 42 may be selected to provide suitable collector voltages by making the collector circuit resistor of each stage successively and appropriately smaller than the collector circuit resistor of the preceding stage with the collector resistor 12 of the first stage being appropriately smaller than the voltage divider resistor 2. The same result may also be achieved by making the collector circuit resistors 12, 22, 32 and 42 and the voltage divider resistor 2 all equal and making the value of voltage divider resistor 4 and the emitter circuit resistors 14, 24, 34, and 44 successively larger. In this manner the base electrode of each transistor is maintained at a definite D. C. potential. This is an important feature of this invention for with the base potential of each transistor fixed, changes in temperature produce relatively small changes in collector current. Without such an arrangement current changes produced by temperature would be extremely large.

The biasing arrangements and circuit configuration described permit the use of a single battery or other direct current power supply. The regulation required of such a power supply need not be great because the current drawn by the amplifier from such a supply is relatively constant. In addition, if the operating points of the various transistors are suitably chosen the amplifier operation will be comparatively independent of variations in that power supply. This independence is due to the simultaneous variation of collector potentials and emitter currents. A further advantage of the circuit outlined above is that the emitter by-pass condensers 15, 25, 35 and 45 and the emitter bias resistors 14, 24, 34 and 44 provide additional filtering for a power supply as well as decoupling between the stages.

The direct coupling of the amplifier stages achieves several desirable results other than the obvious simplification of circuit and elimination of extra components. The effect of temperature upon transistors is particularly manifested by an increase in the zero-emitter collector current. This current increases exponentially with temperature. With the amplifier stages direct coupled, any change in the zero-emitter collector current of one transistor stage will be cancelled out in the collector circuit resistor of that stage by a similar change in the zero-emitter collector current of the next stage. This prevents the cascading of the effects of such changes.

Several features of this amplifier tend to minimize the effect of differences in the parameters of the individual transistors employed. For example, the grounded emitter amplifier stage has a comparatively low input impedance and high output impedance. When two such stages are coupled to each other the impedance mismatch is of such magnitude with respect to the internal impedance difference of individual transistors that it tends to minimize such differences. In addition, this amplifier has a D. C. gain of less than unity. It should be noted that the D. C. gain of any one of the amplifier stages employed in this amplifier is proportional to the ratio of the value of the collector circuit resistor to the value of the emitter circuit resistor. It is a feature of this amplifier that the value of the collector circuit resistor of each stage is less than or of a magnitude similar to the value of the emitter circuit resistor thereby insuring that the amplifier has a D. C. gain near to or less than unity. With low D. C. gain, differences between transistors which affect their D. C. operating characteristics are not amplified and their effect on the amplifier's A. C. operation is minimized.

As noted this amplifier is not a direct current amplifier; however, the stabilization of the D. C. operating points of the transistors employed, and the circuit simplicity make it a highly practical alternating current amplifier. When an alternating current signal is applied to the amplifier across the terminals 55 and 56 it varies the emitter-base voltage of the transistor 10 and thus its base current. The small variations in base current thus obtained cause relatively large changes in the collector current flowing through the collector circuit resistor 12. This in turn causes a larger variation in the emitter-base voltage of the transistor 20 with an accompanying change in that transistor base current thereby effecting a still larger increase in that transistor's collector current. This process of current amplification is repeated in succeeding stages with the amplifier output being the voltage drop across the collector circuit resistor 42 caused by the change thus produced in the collector current of the transistor 40. While this amplifier is shown incorporating four stages it should be understood that it is within the scope of this invention to include more or fewer stages.

By way of illustration and example, and not by way of limitation, typical values of the component of the embodiment of this invention shown in Fig. 1 might be as follows:

| | | |
|---|---|---|
| Resistor 2 | ohms | 5,600 |
| Resistor 12 | do | 5,600 |
| Resistor 22 | do | 5,600 |
| Resistor 32 | do | 5,600 |
| Resistor 42 | do | 5,600 |
| Resistor 4 | do | 12,000 |
| Resistor 14 | do | 13,000 |
| Resistor 24 | do | 15,000 |
| Resistor 34 | do | 21,000 |
| Resistor 44 | do | 45,000 |
| Condenser 15 | mfd | 40 |
| Condenser 25 | do | 40 |
| Condenser 35 | do | 40 |
| Condenser 45 | do | 40 |
| Transistor 10 | (Sylvania) | 2N34 |
| Transistor 20 | (Sylvania) | 2N34 |
| Transistor 30 | (Sylvania) | 2N34 |
| Transistor 40 | (Sylvania) | 2N34 |
| Supply voltage | volts | 50 |

Figure 2:
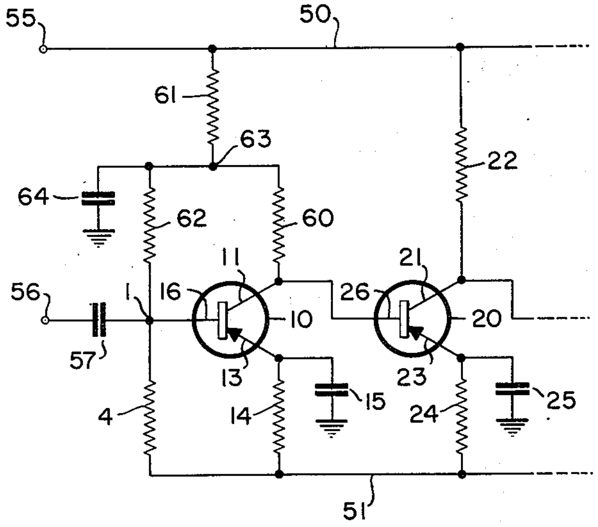
Fig. 2 is a modification of the embodiment shown in Fig. 1 whereby it is more readily possible to maintain a low voltage between the base electrode and collector electrode of the transistor in the first amplifier stage.

Referring now to Fig. 2, there is shown a modification of the amplifier shown in Fig. 1 whereby it is more readily possible to maintain a low voltage between the base electrode and the collector electrode of the transistor in the first stage. In this modification the first amplifier stage again employs the transistor 10 having an emitter electrode 13, a collector electrode 11, and a base electrode 16. The emitter electrode 13 is connected to the conductor 51 by the resistor 14 and is connected to ground through the condenser 15. The collector electrode 11 is connected through the resistors 60 and resistor 61 to the conductor 50. The base electrode 16 is connected to the junction point 1 of the resistors 4 and 62. The resistor 4 is connected to the conductor 51 and the resistor 62 is connected to the junction point 63 of the resistors 60 and 61. The junction point 63 is connected to ground through the condenser 64 which by-passes the resistor 61. The amplifier input terminals are the end terminal 55 of the conductor 50 and the terminal 56 which is connected through the condenser 57 to the junction point 1. This first amplifier stage is coupled to the second amplifier stage by a direct connection between the collector electrode 11 of the transistor 10 and the base electrode of the transistor 20. This second stage and the other succeeding stages not shown are the same as shown in Fig. 1 and the corresponding components shown carry corresponding reference numerals. Also as shown in Fig. 1 the conductors 50 and 51 are connected to a suitable source of direct current.

In the circuit modification just described the value of the resistor 61 should be made large compared to the values of the resistors 60 and 62. In this manner, the major voltage drop is across that resistor and the tolarances of the resistors 60 and 62 need not be close to maintain a low base to collector voltage in that stage. It is desirable to maintain this voltage low to reduce noise in that stage and to make stabilization less critical. The condenser 64, by-passing the resistor 61, prevents A. C. signal degeneration.

By way of illustration and example, and not by way of limitation, typical values of the components 60, 61, 62, and 64 of the modification of this invention shown in Fig. 2 might be as follows:

| | | |
|---|---|---|
| Resistor 60 | ohms | 1,100 |
| Resistor 61 | do | 2,200 |
| Resistor 62 | do | 1,400 |
| Condenser 64 | mfd | 20 |

The other amplifier components would be as heretofore illustrated.

While, in accordance with the provisions of the statutes, I have illustrated and described the best form of the invention now know to me, it will be apparent to those skilled in the art that changes may be made in the form of the apparatus disclosed without departing from the spirit of the invention as set forth in the appended claims, and that in some cases certain features of the invention may sometimes be used to advantage without a corresponding use of other features.

Having now described my invention, what I claim as new and desire to secure by Letters Patent is:

1. A multistage alternating current amplifier having a direct current gain of less than unity, comprising in combination, a direct current power supply having a first and a second terminal, a plurality of transistors each having a collector electrode, an emitter electrode, and a base electrode, each of said transistors being connected as a ground emitter amplifying stage with the collector electrode of each transistor being directly coupled to the base electrode of the transistor in the succeeding stage, each of said transistors having a resistor connecting its emitter electrode directly to said first power supply terminal, each of said transistors having a resistor of less than or of an equal magnitude than said emitter circuit resistor directly connecting its collector electrode to said second power supply terminal, each of said transistors having a condenser connecting its emitter electrode to said second power supply terminal, and a resistive voltage divider connecting the base electrode of the transistor in said first stage to said power supply terminals.

2. Apparatus as specified in claim 1 wherein the values of said emitter circuit resistors are all equal.

3. Apparatus as specified in claim 2 wherein the values of said collector circuit resistors are all equal.

4. A multistage alternating current amplifier, comprising in combination, a plurality of transistor amplifier stages each of said stages employing a transistor having a collector electrode, an emitter electrode and a base electrode, a power supply having a first and second terminal, each of said stages having a resistor connecting the collector electrode of the transistor therein to the first terminal of said power supply, having a resistor directly connecting the emitter electrode of the transistor therein to the second terminal of said power supply, and having a condenser directly connecting the emitter electrode of the transistor therein to the first terminal of said power supply, each of said transistor stages being coupled by a direct connection between the collector electrode of that transistor to the base electrode of the transistor in the succeeding stage, a resistive voltage divider network comprising two resistors connected in series across said power supply terminals, and circuit means connecting the junction of said resistors to the base electrode of the transistor in the first stage, the value of said voltage divider resistors and said emitter and collector circuit resistors being so chosen as to provide a suitable voltage between the collector electrode and base electrode of each transistor.

References Cited in the file of this patent

UNITED STATES PATENTS

| | | |
|---|---|---|
| 2,505,024 | Wintle | Apr. 25, 1950 |
| 2,647,957 | Mallinckrodt | Aug. 4, 1953 |
| 2,647,958 | Barney | Aug. 4, 1953 |
| 2,666,817 | Raisbeck et al. | Jan. 17, 1954 |

OTHER REFERENCES

Bell Text, "The Transistor," pages 184–186, published 1951 by Bell Tel. Labs., New York, N. Y.

Shea Text, "Principles of Transistor Circuits," pp. 102–104, 164; published 1953 by John Wiley & Sons, Inc., New York, N. Y.